COMBINED TRANSISTOR AMPLIFIER AND SWITCHING CIRCUIT
Filed Aug. 15, 1960
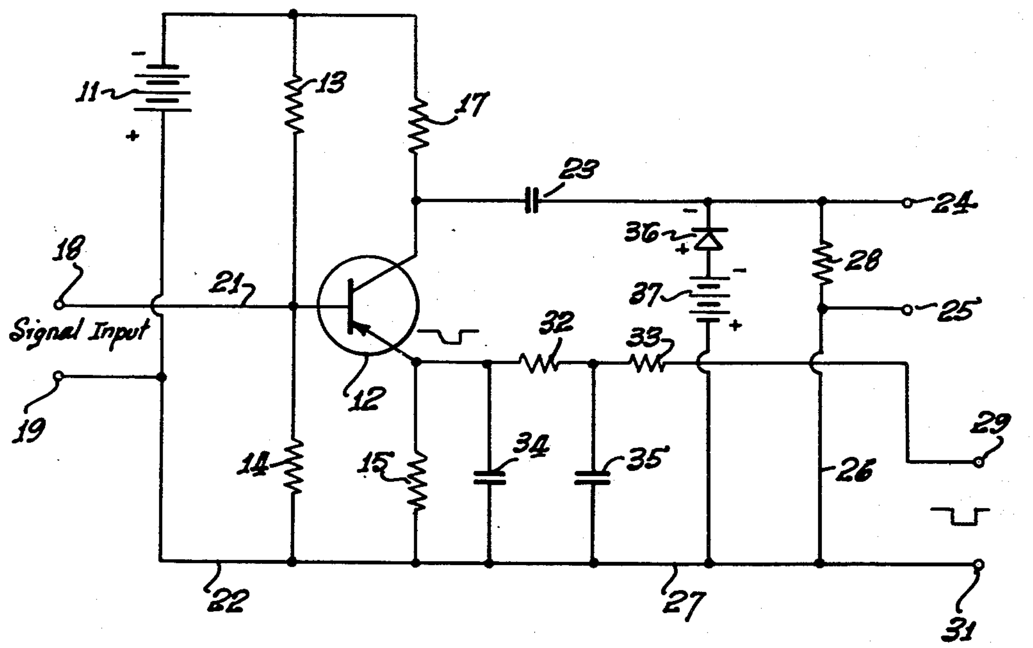
DAVID SHEFFET,
INVENTOR.
BY Spensley & Horn
ATTORNEY.

United States Patent Office 3,107,307

Patented Oct. 15, 1963

3,107,307

COMBINED TRANSISTOR AMPLIFIER AND SWITCHING CIRCUIT

David Sheffet, Altadena, Calif., assignor to Western Geophysical Company of America, Los Angeles, Calif., a corporation of Delaware Filed Aug. 15, 1960, Ser. No. 49,789

5 Claims. (Cl. 307—88.5)

The present invention pertains to electronic circuitry utilizing transistors and more particularly to circuits in which a single transistor simultaneously performs both amplifying and switching functions.

In the geophysical art, as well as in certain other arts, there are severe restrictions upon the size, weight and power consumption of particular electronic apparatus. Transistors and other semiconductor devices have proven especially valuable in the miniaturization of such apparatus. Even further reductions in size, weight and power consumption can be achieved by replacement of electrically operated relays with transistorized electronic switching devices. Furthermore, if it is desired to switch the output of an R-C coupled transistor amplifier an additional reduction could be achieved by having the amplifier transistor perform the switching function through application of an electrical switching pulse to one of its electrodes. However, if the transistor is amplifying relatively weak signals of frequencies below about 100 cycles and if it is necessary to switch off the amplifier output relatively quickly (within 1 to 5 cycles of signal voltage) then a switching transient ordinarily appears in the amplifier output because of the charging of the large output coupling capacitor necessary to pass such low frequency signals. The magnitude of such a switching transient is usually much greater than the magnitude of the signal output and such a voltage surge could be very undesirable, as for example when the signal is a seismic one. In certain geophysical applications wherein multi-channel recorders are utilized, it is frequently desirable to record a short wave train of from one to five signal cycles to provide a time reference point. Such an application is disclosed in copending patent application 49,700, now abandoned, entitled "Geophysical Amplifier," and also assigned to Western Geophysical Company of America. Although a switching transient occurring upon cutoff of this short signal would not affect the time reference information, it would affect other information still being recorded.

It is therefore an object of the present invention to provide transistorized electronic circuitry in which a single transistor simultaneously performs amplifying and switching functions.

It is a further object of the present invention to provide transistorized electronic circuitry in which a single transistor simultaneously performs amplifying and switching functions and which faithfully reproduces the applied signal in the presence of a switching pulse of much greater magnitude.

Other objects and a fuller understanding of the invention may be had by referring to the following description and claims, taken in conjunction with the accompanying drawing, in which there is shown the circuit diagram of the preferred embodiment of the present invention.

The objects of the present invention are accomplished by providing an emitter biased transistor amplifier stage having a collector resistor with as small a resistance as possible while still achieving relatively high stage gain to thereby minimize the collector potential swing, means for applying a switching pulse to the transistor emitter through a filter network which reduces the steepness of the leading edge of the switching pulse, and a diode clipper in shunt with the amplifier output to clip output voltage surges having a magnitude in excess of the expected signal voltage peak.

Referring now to the drawing, there is shown a battery 11 which provides a source of D.C. supply voltage for the operation of a PNP-type transistor 12 having its bias determined by the values of resistors 13, 14 and 15, resistors 13 and 14 forming a voltage divider to set the operating potential level of the transistor base and the resistor 15 providing emitter bias. The foregoing portion of the circuitry is recognizable as the so-called "emitter bias" method of self-biasing a transistor. The collector operating potential is set by a collector resistor 17 which is selected at as low a resistance value as possible while still achieving a relatively high stage gain. It is desired to set the collector operating point as near the supply potential as possible to minimize the collector potential swing upon cutoff of the current flow through the transistor to thereby minimize the switching transient which thereupon occurs. A pair of signal input terminals 18 and 19 are provided to connect with a signal voltage source, the terminal 18 being connected directly to the transistor base through a connecting lead 21, and the terminal 19 connected to the transistor emitter through a connecting lead 22 and the emitter resistor 15. Output voltage is taken from the transistor collector through an output coupling capacitor 23 and applied to an output terminal 24. A common output terminal 25 is connected to the transistor emitter through connecting leads 26 and 27 and through the emitter resistor 15. An output load resistor 28 is connected between the output terminals 24 and 25.

In the above-mentioned geophysical application, the switching pulse utilized to cut off collector current flow in the transistor will ordinarily be a negative rectangular pulse. The switching pulse is applied to switching input terminals 29 and 31. A filter network consisting of resistors 32 and 33 and capacitors 34 and 35 connect the switching input terminals 29 and 31 to the emitter resistor 15 to thereby reduce the rise time of the switching input pulse to soften its steep leading edge and impress the pulse on the transistor emitter. The permissible reduction in rise time will depend upon the frequency of the input signal and how quick a cutoff is desired, and will be within the time range of from about 0.01 second to about 0.2 second for the stated conditions of operation. The magnitude of the pulse must be sufficient to cut off transistor collector current flow and is usually much greater than the relatively weak applied signal voltage.

Also connected between the output terminals 24 and 25 is a diode clipper network consisting of the series combination of diode 36 and threshold level battery 37. The diode and battery are oriented to form a negative peak clipper and the battery voltage is selected to set a conducting threshold of the diode 36 at a level slightly in excess of the expected output signal from the transistor 12, i.e., the diode does not clip the desired signal output voltage. It is recognized that certain currently available types of diodes have internal "pre-thresholds" and if such a device is utilized in the present invention then the threshold battery may be reduced in voltage or eliminated entirely, depending upon the signal output expected Diodes having such an internal "pre-threshold" possess the characteristic of non-linear clipping in that the degree of clipping is somewhat proportional to the applied voltage. Such diodes are preferred for the clipping diode in the preferred embodiment, although a conventional diode clipper has been illustrated for ease in explanation of the entire circuit.

Thus, there has been described a novel transistor amplifier circuit in which the transistor simultaneously performs amplifying and switching functions and faithfully amplifies a weak signal input in the presence of a switching pulse of much greater magnitude. In summary, the basic transistor circuitry is of the common emitter configuration in which the signal voltages are applied to the base and appear as an amplified voltage at the collector. The transistor collector current can be cut off by application of a switching pulse to the transistor emitter through a filter network which softens the leading edge of the pulse to thereby reduce the transient which appears in the output circuit due to the relatively abrupt cutoff of transistor collector current flow. The magntude of the switching transient is also reduced by operating the transistor collector at a potential as close to the supply potential as practical to thereby limit the collector potential swing when the collector current is cut off. The negative switching transient that does appear in the output circuit is then suppressed by a diode clipper biased to pass the desired amplified signal voltage. The aforementioned two methods of reducing the magnitude of the switching transient before it is passed to the clipping diode are necessary to enable the clipping diode to hold the magnitude of the transient at a level which will permit accurate identification of the signal output voltage.

Although the invention has been described with a certain degree of particularity, it is understood that the present disclosure has been made only by way of example and that numerous changes in the details of the circuitry and the combination and arrangement of parts can be resorted to without departing from the spirit and the scope of the invention as hereinafter claimed. For example, an NPN type transistor can be substituted for the PNP type illustrated, accompanied by a reversal in supply voltage polarity and clipping diode and threshold bias polarity. Or, the collector current can be cut off by application of the switching pulse to the base rather than to the emitter of the transistor, the polarity of the switching pulse then necessarily being reversed. And, although the invention has been described in an embodiment particularly suitable for use in geophysical applications, it is equally adaptable for use at other frequencies where similaar switching transient problems occur. Furthermore, if it is desired to also eliminate the transient occurring when the collector current is switched on, another properly oriented clipping diode can be utilized to suppress that oppositely polarized transient.

What is claimed is:

1. In a transistor amplifier stage powered from a source of direct current potential and for transmitting signal voltages from an input circuit to an output circuit, said signal voltages having a peak magnitude not in excess of a predetermined value, said amplifier stage including a transistor having a base electrode, a collector electrode and an emitter electrode; said signal input circuit being coupled to the said base electrode; means coupled to said emitter electrode for forward biasing said emitter electrode relative to said base electrode of said transistor; impedance means coupled betwen one side of said source of direct current potential and the collector electrode of said transistor and establishing the direct current operating potential level of the collector electrode of said transistor as close as possible to the output voltage of said source of direct current potential while achieving a predetermined stage gain to thereby minimize the variation in the collector potential level upon interruption of collector current flow; switching pulse input terminals adapted for the selective application thereto of a predetermined voltage pulse of substantially rectangular wave shape; filter means coupling one of said switching pulse input terminals to the emitter electrode of said transistor and, the other of said switching pulse input terminals being coupled to the other side of said source of direct current potential for modifying a substantially rectangular switching pulse applied to said switching pulse input terminals by slowing down at least one of the rise time and the decay time of said substantially rectangular pulse to a predetermined time within the range of from one to fixe cycles of the signal voltage and applying the so modified pulse to the emiter electrode of said transistor to cut off the flow of collector current; and voltage peak clipping means in said output circuit to clip any output voltage surge having a magnitude greater than that of an amplified input signal of said predetermined peak value; said output circuit being coupled to said collector electrode of said transistor; said voltage peak clipping means being coupled between said collector electrode and said emitter electrode of said transistor.

2. The circuit as defined in claim 1 wherein said impedance means for establishing the direct-current operating potential of said transistor collector includes a collector resistance means connecting said collector with said source of direct-current potential.

3. The circuit at defined in claim 1 wherein said voltage peak clipping means includes a clipping diode having a conducting threshold level slightly greater than the magnitude of an amplified input signal of said predetermined peak value.

4. The circuit as defined in claim 1 wherein said filter means consists of a decoupling network including series resistance means and shunt capacitance means.

5. An emitter biased transistor amplifier stage for amplifying input signal voltages within the frequency range of from about 30 to about 100 cycles per second and for switching off output voltages in response to an applied switching pulse within a time range of from 1 to 5 cycles of the input signal voltage comprising, in combination; first and second supply voltage terminals, said supply voltage terminals being adapted for connection to a source of direct-current potential; a transistor having a collector electrode, a base electrode and an emitter electrode; a collector resistance means connecting the collector electrode of said transistor to said first supply voltage terminal, said collector resistance means having a resistance as low as permissible while achieving a predetermined stage gain; first voltage dividing network resistance means connecting the base electrode of said transistor to said first supply voltage terminal; second voltage dividing network resistance means connecting the base electrode of said transistor to said second supply voltage terminal; emitter resistance means connecting the emitter electrode of said transistor to said second supply voltage terminal; first and second signal input terminals, said first signal input terminal being connected to the base electrode of said transistor and said second signal input terminal being connected to said second supply voltage terminal; first and second output voltage terminals; output coupling capacitance means connecting the collector electrode of said transistor to said first output voltage terminal, said second output voltage terminal being connected to said second supply voltage terminal; output load resistance means connected between said first and second output voltage terminals, the amplified signal voltages appearing across said output load resistance means falling within an envelope appearing between first and second predetermined voltage levels; output clipping diode means connected between said first and second output voltage terminals, said diode means being adapted to clip output voltages having magnitudes in excess of at least one of said predetermined levels; first and second switching pulse input terminals; and filtering means connecting said first and second switching pulse input terminals across said emitter resistance means, said filtering means providing a predetermined switching pulse rise time at the emitter electrode of said transistor when a predetermined rectangular switching pulse is applied to said first and second switching pulse input terminals, the rise time of said switching pulse being within the range of from 1 to 5 cycles of said input signal voltage.

References Cited in the file of this patent

UNITED STATES PATENTS

| | | |
|---|---|---|
| 2,773,945 | Theriault | Dec. 11, 1956 |
| 2,774,825 | Sherr | Dec. 18, 1956 |
| 2,803,758 | Whitenack | Aug. 20, 1957 |
| 2,823,312 | Keonjian | Feb. 11, 1958 |